Figure 1:
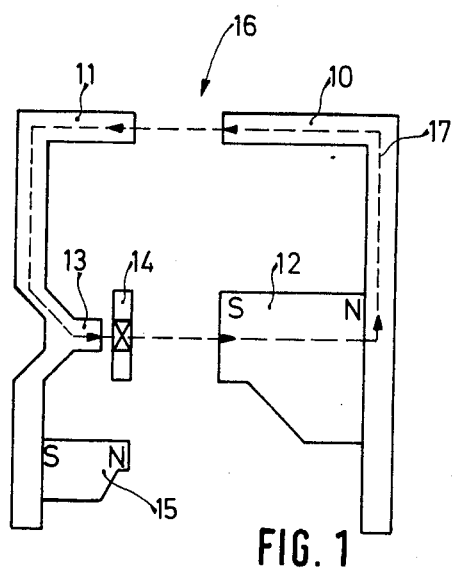

United States Patent [19]

Roozenbeek

[11] 4,112,408

[45] Sep. 5, 1978

[54] DEVICE FOR PRODUCING AN ELECTRICAL PULSE IN RESPONSE TO PASSAGE OF A MAGNETICALLY CONDUCTING MEMBER THROUGH AN AIR GAP

[75] Inventor: Herman Roozenbeek, Schwieberdingen, Germany

[73] Assignee: Robert Bosch GmbH, Stuttgart, Germany

[21] Appl. No.: 844,352

[22] Filed: Oct. 21, 1977

[30] Foreign Application Priority Data

Oct. 22, 1976 [DE] Fed. Rep. of Germany ....... 2647818

[51] Int. Cl.² ............................................ H01L 43/04
[52] U.S. Cl. ............................... 338/32 H; 323/94 H; 324/251
[58] Field of Search ............................ 338/32 R, 32 H; 324/207, 208, 251, 252, 235; 340/199; 323/94 H; 335/205, 207, 215; 73/517 R, 518, 519

[56] References Cited

U.S. PATENT DOCUMENTS

| | | | |
|---|---|---|---|
| 3,340,467 | 9/1967 | WhanHa | 324/228 |
| 3,340,468 | 9/1967 | Chu | 324/228 |
| 3,845,445 | 10/1974 | Brown et al. | 338/32 H |
| 4,066,962 | 1/1978 | Jaffe | 324/235 X |

*Primary Examiner*—C. L. Albritton
*Attorney, Agent, or Firm*—Flynn & Frishauf

[57] ABSTRACT

A magnetically conducting flux-by-pass member shunts the main magnetic circuit, so that it no longer affects a Hall generator therein, while at the same time it completes an auxiliary magnetic circuit containing an auxiliary permanent magnet that causes magnetic flux to pass through the Hall generator in the opposite direction. The reversal of the magnetic flux in the Hall generator upon insertion and again upon removal of the flux-by-pass member increases the amplitude of the Hall generator signal and steepens the rise and fall of the signal.

3 Claims, 2 Drawing Figures

U.S. Patent  Sept. 5, 1978  4,112,408

DEVICE FOR PRODUCING AN ELECTRICAL PULSE IN RESPONSE TO PASSAGE OF A MAGNETICALLY CONDUCTING MEMBER THROUGH AN AIR GAP

This invention concerns a device for producing electrical signals in response to each close passage of a mechanically moved ferromagnetically conducting member, as is particularly useful for providing signals indicating the rate of revolution of an engine or the moment when a swinging or rotating member has a particular angular position.

A device is already known in which there is provided a stator containing a permanent magnet and a Hall generator and providing an air gap in the stator, so that when a flux-by-pass member passes through the air gap, the magnetic circuit of the magnet is short-circuited so as to exclude the Hall generator from the magnetic circuit. The output signal that can be obtained from this device upon the passage of the flux-by-pass member through the air gap is of relatively low amplitude and also has relatively low steepness of rise and fall. Furthermore, the amplitude of the output signal of the Hall generator can be so greatly changed by the effect of temperature, that any threshold switching device connected in circuit with the Hall generator can no longer be used for systematic evaluation of the output signal of the Hall generator and very often, under unfavorable conditions, the output signal of the Hall generator no longer reaches the switching threshold of the threshold switch, so that the latter no longer provides a corresponding output signal.

SUMMARY OF THE INVENTION

Briefly, a second magnet is provided and mounted on a portion of the stator in such a configuration that when the flux-by-pass member is in the air gap, the second magnet sets up a magnetic flux in the Hall generator in a direction opposite to that of magnetic flux in the Hall generator from the usual magnet that provides flux to the Hall generator when the air gap is clear of intrusion by the flux-by-pass member. Preferably the flux-by-pass member has a first portion that short-circuits the magnetic circuit of the magnet that provides flux to the Hall generator when the flux-by-pass member is absent from the air gap, and a second portion that merges with the first where the two portions join, which provides an auxiliary magnetic circuit including the second magnet and the Hall generator. It is convenient to provide the second magnet on a branch of the portion of the stator that is on the same side of the air gap as the Hall generator.

The arrangement just described has the advantage that by causing the flux in the Hall generator to be reversed as the flux-by-pass member passes through the air gap, the amplitude of the output signal of the Hall generator is increased and, moreover, there is also an increase in steepness of rise and fall times of the signal. With such an output signal, the switching threshold of a following threshold switch can be so set that even under unfavorable operating conditions, thus particularly in the case of effects of large temperature changes, the switching threshold of the threshold switch device will reliably be reached for every passage of the flux-by-pass member, so that an output signal is surely and reliably provided by the threshold switch device.

Figure 2:
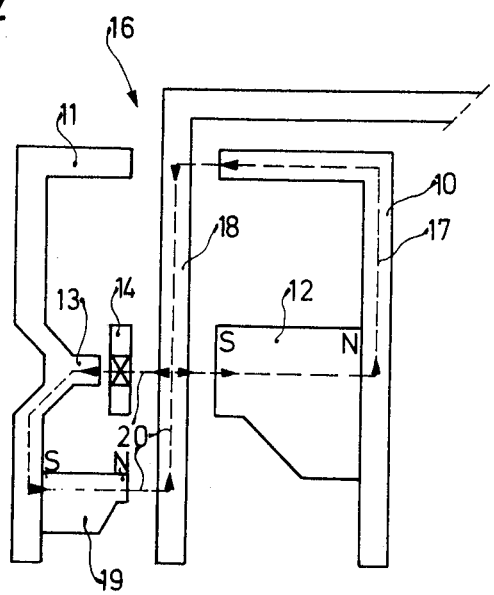

The invention is further described by way of illustrative example with reference to the annexed drawing, in which:

FIG. 1 is a diagram of the device according to the invention and its magnetic circuit in the condition in which there is no intrusion of a flux-by-pass member in the air gap, and FIG. 2 is a diagram of the same device with a flux-by-pass member in its air gap.

FIG. 1 illustrates a device for producing electrical signals that could for example be used as a tachogenerator for measuring the speed of rotation of a shaft. The device has two stator parts 10 and 11 of magnetically conducting material. The first stator part 10 is L-shaped, shown as an inverted L in the drawing, and it carries a permanent magnet 12 extending from the long leg of the L in a direction parallel to the short leg of the L. The second stator part 11 has one leg facing the short leg of the L of the first stator part 10 and also a middle leg 13 provided for a Hall generator 14. Furthermore, the yoke of the second stator part 11 is continued beyond the middle leg to carry a second permanent magnet 15. An air gap 16 is provided between the two stator parts 10 and 11. The permanent magnet 12, the first stator part 10, the second stator part 11 and the Hall generator 14, acting across the air gap 16, form a main magnetic circuit of which the magnetic flux is indicated by broken lines 17.

In FIG. 2, the device of FIG. 1 is shown with a flux-by-pass member 18 in the air gap 16. The flux-by-pass member may for example be connected to a rotating part of an engine or other machine, so that the rate of revolution of the rotating part can be continuously indicated by means of the output signal of the Hall generator 14. When the flux-by-pass member 18 is in the air gap 16, the magnetic flux of the main magnetic circuit in the stator 11 is interrupted, because the main magnetic circuit is short-circuited, so that it flows through the first stator part 10, a first portion of the flux-by-pass member 18 and the permanent magnet 12. The Hall generator 14 is thus no longer exposed to the magnetic flux that is produced by the permanent magnet 12. On the other hand, by means of the magnet 15, an auxiliary magnetic circuit is formed that is made up of a second portion of the flux-by-pass member 18, the Hall generator 14, a part of the second stator portion 11 and the permanent magnet 15. The magnetic flux of the auxiliary magnetic circuit is indicated by a broken line 20. It passes through the Hall generator 14 in a direction opposite to that in which the original magnetic flux of the main magnetic circuit passed. As the result of the direction reversal of the magnetic flux, the amplitude of the output signal of the Hall generator is raised and, moreover, the steepness of signal rise and fall is improved.

Although the invention has been described with reference to a particular illustrative example, it will be recognized that variations and modifications are possible within the inventive concept.

Instead of the Hall generator a Wiegand sensor (U.S. Pat. No. 3,757,754) can be provided.

I claim:

1. A device for producing an electrical signal in response to movement of a magnetically conducting flux-by-pass member thereof past a stator member thereof that comprises a first permanent magnet and a Hall generator and provides an air gap in the stator structure through which said flux-by-pass member is able to pass and in passing to complete a magnetic circuit for said permanent magnet that excludes said Hall generator, said device having the improvement wherein:

a second magnet (15) is provided and mounted on a portion of said stator in such a configuration that when said flux-by-pass member (18) is in said air gap (16), said second magnet (15) sets up a magnetic flux in said Hall generator (14) in a direction opposite to that of magnetic flux in said Hall generator (14) set up by said first magnet (12) when said air gap (16) is clear of intrusion by said flux-by-pass member.

2. A device as defined in claim 1, in which when said flux-by-pass member (18) is in said air gap (16), a first portion thereof short-circuits the magnetic circuit of said first magnet (12) and a second portion thereof, merging with said first portion at one end thereof, completes an auxiliary magnetic circuit including said second magnet (15) and said Hall generator (14).

3. A device as defined in claim 2, in which said second magnet is located on a branch of the portion of said stator member which is on the same side of said air gap as is said Hall generator.

* * * * *